United States Patent
Chen et al.

(10) Patent No.: US 7,235,410 B2
(45) Date of Patent: Jun. 26, 2007

(54) METHOD FOR PATCHING UP THIN-FILM TRANSISTOR CIRCUITS ON A DISPLAY PANEL BY LOCAL THIN-FILM DEPOSITION

(75) Inventors: Yi-Shen Chen, Chang Hua (TW); Liang-Hsing Fan, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 150 days.

(21) Appl. No.: 11/066,282

(22) Filed: Feb. 28, 2005

(65) Prior Publication Data

US 2005/0142669 A1 Jun. 30, 2005

Related U.S. Application Data

(62) Division of application No. 10/706,993, filed on Nov. 14, 2003, now Pat. No. 6,872,580.

(30) Foreign Application Priority Data

Jul. 1, 2003 (TW) .............................. 92117999 A

(51) Int. Cl.
*H01L 21/00* (2006.01)
(52) U.S. Cl. .................................. 438/4; 257/E21.001
(58) Field of Classification Search .................... 438/4, 438/149, 584, 669, 671, 674
See application file for complete search history.

*Primary Examiner*—Scott B. Geyer
(74) *Attorney, Agent, or Firm*—Troxell Law Office, PLLC

(57) ABSTRACT

A method for patching up thin-film transistor (TFT) circuit patterns on a display panel comprises the following steps. Firstly, a mask having an opening is placed above the display panel and the opening corresponds to the location of the cracks of the circuits on the display panel. Subsequently, a plasma sputtering procedure is performed to deposit a metal thin film through the opening of the mask on the display panel so as to connect the broken circuits. When the metal thin film is covered on a plurality of the circuits, a laser cut-out procedure is performed to cut apart the metal thin film on the plurality of the circuits so as to prevent the different circuits from short circuits.

5 Claims, 5 Drawing Sheets

METHOD FOR PATCHING UP THIN-FILM TRANSISTOR CIRCUITS ON A DISPLAY PANEL BY LOCAL THIN-FILM DEPOSITION

RELATED APPLICATIONS

This application is a Division of currently application U.S. Ser. No. 10/706,993 entitled "METHOD FOR PATCHING UP THIN-FILM TRANSISTOR CIRCUITS ON A DISPLAY PANEL BY LOCAL THIN-FILM DEPOSITION" and filed on Nov. 14, 2003 now U.S. Pat. No. 6,872,580.

FIELD OF THE INVENTION

The present invention relates to a method for patching up circuit patterns on a display panel and, more specifically, to a method for patching up thin-film transistor (TFT) circuits on a display panel by local thin-film deposition.

BACKGROUND OF THE INVENTION

With rapid advancement in fabrication of integrated circuits, the electronic technology makes continuous development and progress to urge a variety of electronic products toward digitization. Furthermore, the electronic products are designed to be compact, multi-function and high-speed such that the finished products are more portable and utility to meet the requirements of life. Particularly, since multimedia electronic products providing powerful arithmetical ability and easily processing digital information such as a variety of sounds, images and graphics, are preferred by consumers, image players are popularly developed and employed. Display screens are installed in personal digital assistants (PDAs), notebooks, discman, digital cameras or mobile phones etc. to facilitate browsing information or images.

On the other hand, with rapid advancement in the fabrication of thin film transistors, planar display devices such as liquid crystal displays (LCDs) and organic light emitting diode displays (OLEDs) whose performance is continuously enhanced are largely applied in various electronic products such as a Personal Digital Assistant (PDA) device, a notebook computer, a video camera and a mobile phone. Moreover, since the related manufacturers aggressively invest in research & development and employ large-scale fabricating equipment, the quality of the planar display devices is unceasingly improved and the price thereof is continuously decreased. This promptly broadens the application of the planar display devices.

In the fabrication of a display panel, a large quantities of TFTs, pixel electrodes and patterns of crisscrossing scan lines and data lines are fabricated on a glass substrate by thin film deposition and photolithography and etching processes to construct a desired pixel array. Moreover, related circuit patterns fabricated on the glass substrate in order to provide operation voltages and signals desired for the TFTs of each pixel element extend outward from the pixel array to connect with chips and components surrounding the glass substrate. In such a way, timing controller chips and source driver ICs fabricated at the outer edge of the glass substrate can transmit data signals to each of the pixel elements through the circuit patterns on the display panel. In addition, gate driver ICs fabricated at the side of the glass substrate can also transmit scan signals to each of the pixel elements through the circuit patterns on the display panel.

Since the glass substrate needs to be transferred back and forth between different machines in the whole fabricating process of the display panel, collisions and frictions frequently occurred in transportation of the glass substrate cause scrapes of the circuits on the glass substrate. Particularly, when the circuits are severely damaged to be broken, the desired electrical connections cannot be effectively provided. Refer to FIG. 1A, showing scrapes 101 of the circuits 10 on the panel suffering an improper external force. FIG. 1B shows shell-like fractures 102 of the circuits 10 on the panel due to the other undesired factors such as damages of the glass substrate.

In the current production of display panels, when the circuits of the glass substrate are severely damaged, the glass substrate is often discarded. However, this leads to great loss. Therefore, it is desired to find out a method to effectively repair the broken TFT circuits so as to reduce losses.

SUMMARY OF THE INVENTION

An object of the present invention is to provide a method for patching up cracks of thin-film transistor (TFT) circuits on a display panel.

A method for patching up thin-film transistor (TFT) circuit patterns on a display panel is disclosed in this invention. This method comprises the following steps. Firstly, a mask having an opening is placed above the display panel and the opening corresponds to the location of the cracks of the circuits on the display panel. Subsequently, a plasma sputtering procedure is performed to deposit a metal thin film through the opening of the mask on the display panel so as to connect the broken circuits. When the metal thin film is covered on a plurality of the circuits, a laser cut-out procedure is performed to cut apart the metal thin film on the plurality of the circuits so as to prevent the different circuits from short circuits.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

First Embodiment

Figure 1A:
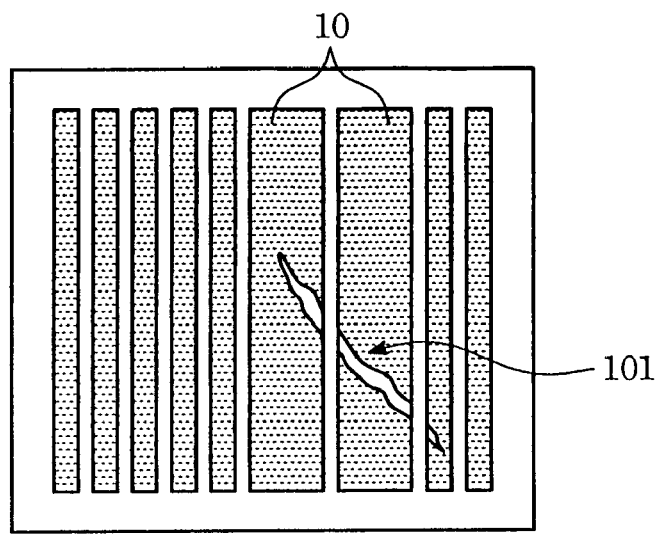
FIGS. 1A to 1B show damages occurred in the TFT circuits on a display panel.
Figure 1B:
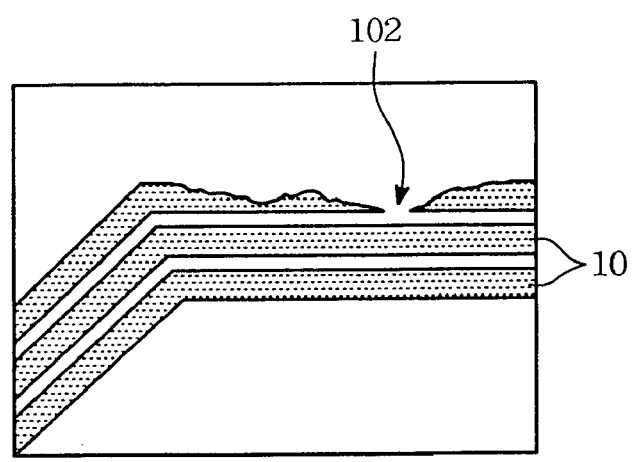
Figure 2A:
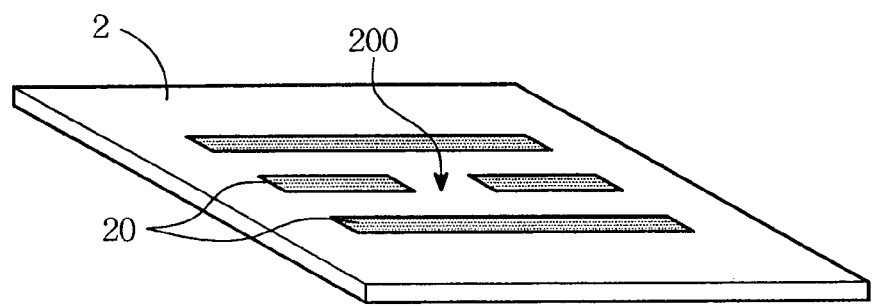
FIGS. 2A to 2D are the steps of patching up the TFT circuits by plasma sputtering in accordance with a first embodiment of this invention.
Figure 2B:
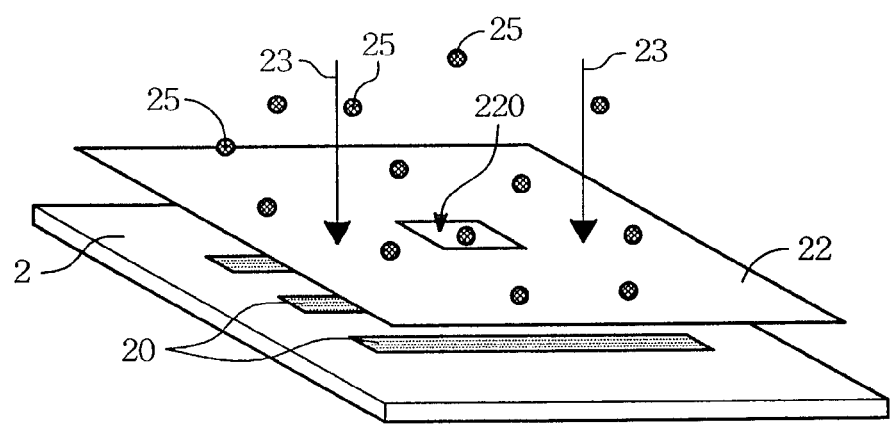

FIGS. 2A to 2D show the steps of the method for patching up cracks and breaches of thin-film transistor (TFT) circuit patterns on a display panel in this invention. FIG. 2A shows a breach 200 of TFT circuits 20 on the surface of a display panel 2 caused by scraping. In the repairing process, the display panel 2 is firstly placed in a plasma chamber, and a mask 22 is then placed above the display panel 2 as shown in FIG. 2B. The mask 22 has an opening 220 corresponding to the breach 200 of the circuits on the display panel 2. Preferably, the width of the opening 220 is slightly larger than or equals to the line width of the TFT circuit 20. The length of the opening 220 may be adjusted according to the extension of the breach 200. Generally, the length of the opening 220 is slightly greater than that of the breach 200 such that the metal material deposited through the opening 220 can effectively connect the circuit patterns at the two ends of the breach 200.

Figure 2C:
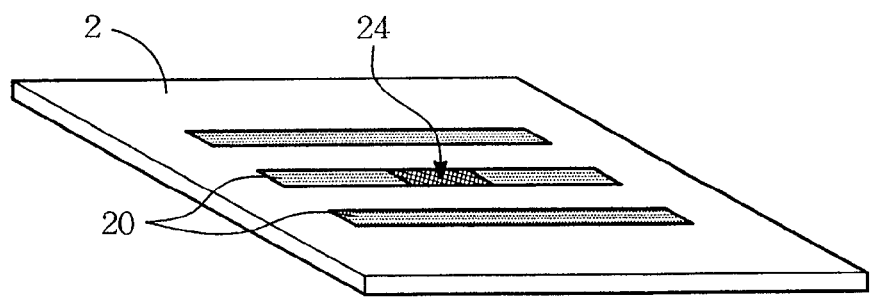
Figure 2D:
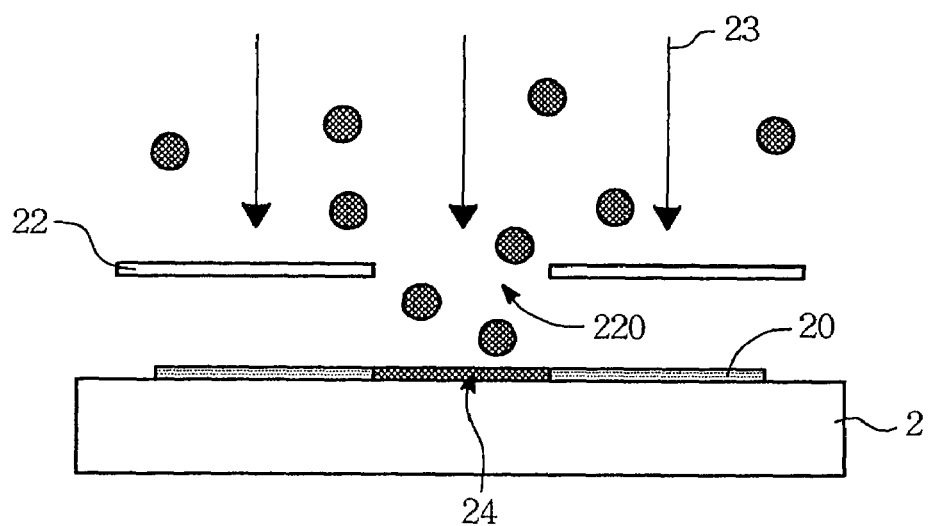

Subsequently, a plasma sputtering procedure (as shown by arrows 23 in FIG. 2B) is performed to sputter excited and accelerated metal ions 25 onto the glass substrate 2 through the opening 220 of the mask 22 such that a metal thin film 24 is deposited on the cracked TFT circuit 20 to connect the broken circuit. Refer to FIG. 2D, showing a side view of the plasma sputtering 23, falling metal ions 25 and the deposited metal thin film 24 on the display panel 2. After completion of the sputtering procedure, as shown in FIG. 2C, the metal thin film 24 is deposited on the breach 200 of the TFT circuit 20 to have the desired electrical connection.

Figure 3:
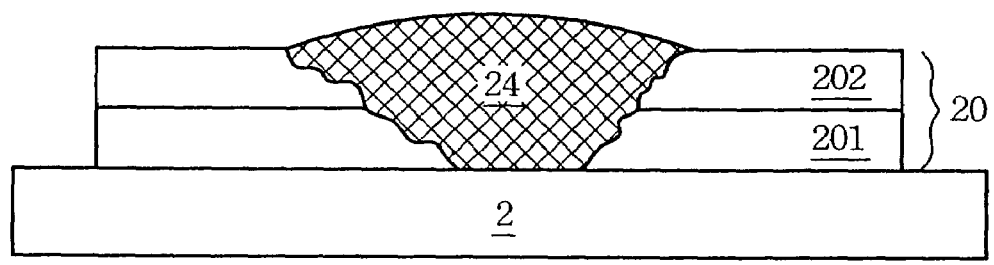
FIG. 3 is the step of repairing the breaches of metal layers of different materials with an aluminum metal.

Generally, the material of the TFT circuit 20 can be chromium, tungsten, tantalum, titanium, molybdenum, platinum, aluminum or any combinations thereof. The metal thin film 24 used to repair circuits is composed by aluminum since the aluminum material has a better electrical conductivity and can provide a better electrical connection for the broken TFT circuit 20. Furthermore, referring to FIG. 3, the TFT circuit 20 on the display panel 2 is formed by depositing a first metal layer 201 and a second metal layer 202 in turn, and the material of the first metal layer 201 is different from that of the second metal layer 202. Under such condition, the aluminum thin film 24 may be deposited on the display panel 2 by the above-mentioned plasma sputtering to fill the breaches of the first metal layer 201 and the second metal layer 202 so as to repair the circuits.

Second Embodiment

Figure 4A:
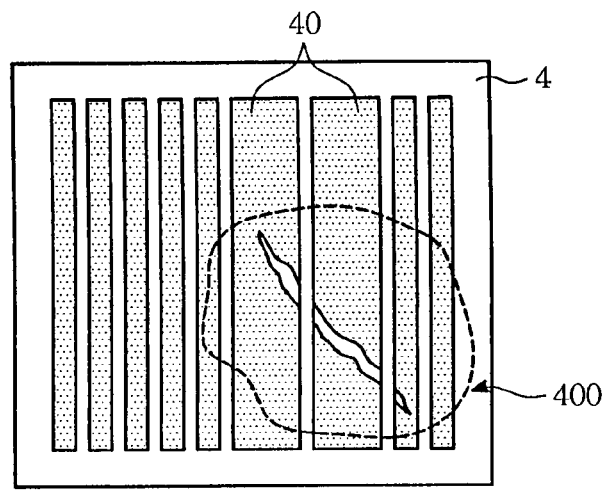
FIGS. 4A to 4C are the steps of patching up cracks and breaches of the TFT circuits in accordance with a second embodiment of this invention.

The first embodiment relates to repairing of each of the TFT circuit. All the circuit cracks in a region can also be repaired through one metal thin film deposition. Refer to FIG. 4A, showing the scrapes of TFT circuits 40 on the surface of a display panel 4. Since these TFT circuits 40 are densely arranged, the scrapes may transversely extend the several TFT circuits 40 arranged side by side when the TFT circuits 40 suffer the damage of the external force. As shown in FIG. 4A, the scrapes traverse three adjacent TFT circuits to form a crack region 400.

Figure 4B:
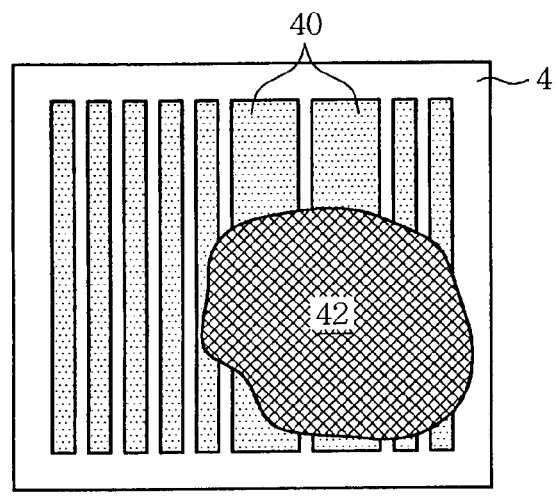
Figure 4C:
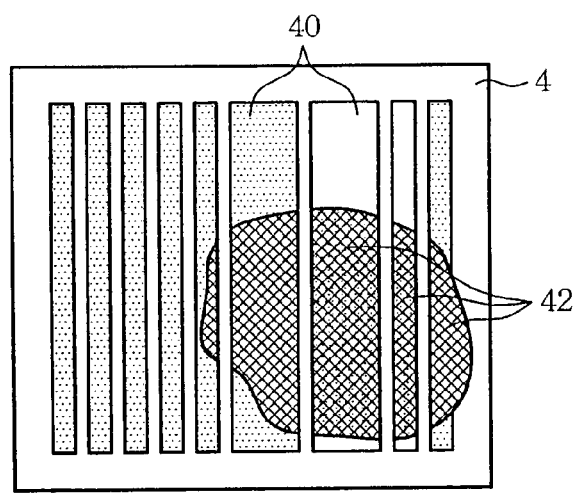

In the method for patching up the circuit patterns of this invention, referring to FIG. 4B, a metal thin film 42 is locally deposited on the surface of the display panel 4 to completely cover the crack region 400 on the display panel 4. The locally deposited metal thin film 42 covers five adjacent TFT circuits 40 and a laser cut-out procedure is necessary to remove portions of the metal thin film 42 between the spaces of the circuit patterns, as shown in FIG. 4C so that the metal thin film 42 on these TFT circuits 40 is cut apart and the TFT circuits 40 are spaced from each other to prevent short-circuits between different circuits.

Preferably, a mask may be used to restrict the range of the locally deposited metal thin film 42 when depositing. The mask has an opening pattern corresponding to the crack region 400 and the size of the opening pattern is greater than that of the crack region 400 such that the locally deposited metal thin film 42 can cover the whole crack region 400 completely. After the mask is placed above the display panel 4, the desired locally deposited metal thin film 42 is fabricated by plasma sputtering or chemical vapor deposition (CVD). It is not necessary to produce a corresponding mask according to the size of the crack region 400 as long as the opening pattern of the selected mask is greater than the whole crack region 400.

As same in the above-mentioned, the material of the TFT circuit 40 can be chromium, tungsten, tantalum, titanium, molybdenum, platinum, aluminum or any combinations thereof. The locally deposited metal thin film 42 used to repair circuits is composed by aluminum. Furthermore, the TFT circuit 40 may be formed by stacking up a first metal layer and a second metal layer, and the material of the first metal layer is different from that of the second metal layer. Under such condition, the metal thin film 42 of aluminum may be deposited to fill the breaches of the first metal layer and the second metal layer so as to repair the circuits.

Third Embodiment

Figure 5A:
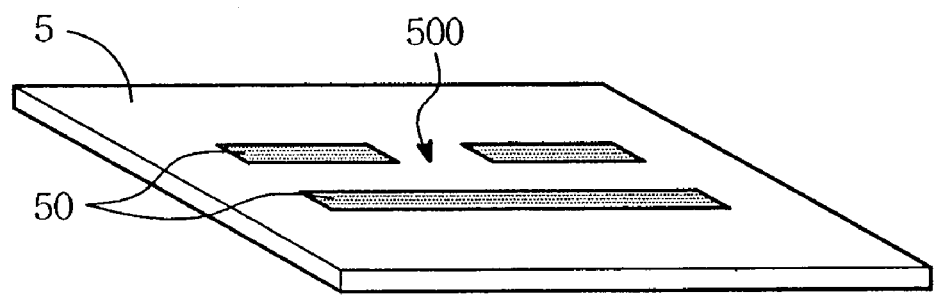
FIGS. 5A to 5B are the steps of patching up the TFT circuits without a mask in accordance with a third embodiment of this invention.
Figure 5B:
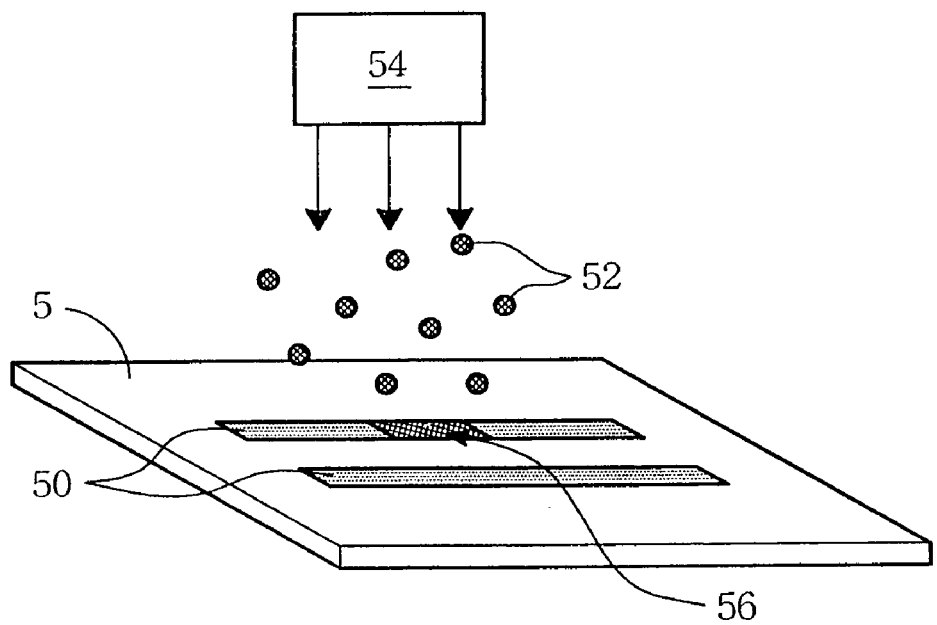

When the crack of the circuit is minute, a metal thin film deposition may be performed on the crack location of the circuit without a mask. Referring to FIG. 5A, a crack 500 is occurred in a TFT circuit 50 on a display panel 5. The display panel 5 is placed in a CVD chamber and gaseous metal compounds 52 such as $W(CO)_6$ are conducted into the chamber such that the room above the display panel 5 is occupied by the gaseous metal compounds 52, as shown in FIG. 5B. Subsequently, energy is transmitted above the location of the crack 500 occurred in the TFT circuit 50 to ionize the gaseous metal compounds 52 into aluminum particles. The aluminum particles can be deposited along the direction of the TFT circuit 50 to form a metal thin film 56 to cover the crack 500 of the TFT circuit 50.

Preferably, the step of energy transmission may be achieved by laser beam irradiation and focus ion beam irradiation. The laser beam or focus ion beam is used to scan the entire section of the crack 500 along the direction of the TFT circuit 50 to have the ionized aluminum particles fall down and attach to the crack 500 so as to patch up the circuit. FIG. 5B shows a laser 54 used to ionize the gaseous metal compound 52 to form the desired metal thin film 56.

As mentioned in the above, the material of the TFT circuit 50 can be chromium, tungsten, tantalum, titanium, molybdenum, platinum, aluminum or any combinations thereof. The locally deposited metal thin film 42 used to repair circuits is composed by aluminum. Furthermore, the TFT circuit 50 may be formed by stacking up a first metal layer and a second metal layer, and the material of the first metal layer is different from that of the second metal layer. Under such condition, the metal thin film 56 of aluminum may also be deposited to fill the breaches 500 of the first metal layer and the second metal layer so as to repair the circuits.

Comparing with discarding the glass substrate of broken circuits in the prior art, the circuit repairing method of this invention can save a lost of costs. Take example by a display panel manufacturing factory having production of eight hundred thousand sheets per month, about 0.3–0.4% glass substrates of broken TFT circuits are made during module assembling. In the event that the price of each display panel is calculated by $NT 500, the method of this invention may save about one million and fifty thousand dollars for the factory.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

The invention claimed is:

1. A method for patching up circuit patterns of thin-film transistor (TFT) circuits on a display panel, comprising:
    placing a mask having an opening above the display panel, wherein the opening corresponds to the location of cracks of the circuits on the display panel; and
    performing a plasma sputtering procedure to deposit a metal thin film through the opening of the mask on the display panel so as to connect the broken circuits.

2. The method of claim 1, wherein a plurality of the TFT circuits on the display panel are exposed and the metal thin film is deposited through the opening of the mask.

3. The method of claim 2, further comprising a laser cut-out procedure after the metal thin film is deposited to cut apart the metal thin film on the plurality of the TFT circuits so as to prevent the different TFT circuits from short circuits.

4. The method of claim 1, wherein the TFT circuits are formed by depositing a first metal layer and a second metal layer in turn, and the first metal layer and the second metal layer are respectively made of a material selected from the group consisting of chromium, tungsten, tantalum, titanium, molybdenum, platinum, aluminum or any combinations thereof.

5. The method of claim 4, wherein the metal thin film is made of aluminum and is deposited to fill breaches of the first metal layer and the second metal layer.

* * * * *